(12) United States Patent
Feldt et al.

(10) Patent No.: US 9,325,285 B2
(45) Date of Patent: Apr. 26, 2016

(54) METHOD OF REDUCING UN-CORRELATED NOISE IN AN AUDIO PROCESSING DEVICE

(71) Applicants: Oticon A/S, Smørum (DK); Sennheiser Communications A/S, Ballerup (DK)

(72) Inventors: Svend Feldt, Ballerup (DK); Thomas Kaulberg, Smørum (DK); Torben Christiansen, Ballerup (DK); Claus Benjaminsen, Somerville, MA (US)

(73) Assignees: OTICON A/S, Smorum (DK); SENNHEISER COMMUNICATIONS A/S, Ballerup (DK)

( * ) Notice: Subject to any disclaimer, the term of this patent is extended or adjusted under 35 U.S.C. 154(b) by 142 days.

(21) Appl. No.: 14/174,562

(22) Filed: Feb. 6, 2014

(65) Prior Publication Data

US 2014/0219474 A1    Aug. 7, 2014

Related U.S. Application Data

(60) Provisional application No. 61/761,708, filed on Feb. 7, 2013.

(30) Foreign Application Priority Data

Feb. 7, 2013  (EP) .................... 13154317

(51) Int. Cl.
| | |
|---|---|
| *H03G 5/00* | (2006.01) |
| *H03G 3/00* | (2006.01) |
| *H03F 1/32* | (2006.01) |
| *H04R 3/04* | (2006.01) |
| *H03G 7/00* | (2006.01) |
| *H04R 27/00* | (2006.01) |
| *H04R 3/00* | (2006.01) |

(52) U.S. Cl.
CPC ................. *H03G 3/00* (2013.01); *H03F 1/327* (2013.01); *H03G 7/002* (2013.01); *H04R 3/005* (2013.01); *H04R 3/04* (2013.01); *H04R 27/00* (2013.01); *H04R 2410/07* (2013.01)

(58) Field of Classification Search
None
See application file for complete search history.

(56) References Cited

U.S. PATENT DOCUMENTS

| | | | | |
|---|---|---|---|---|
| 6,098,036 | A  * | 8/2000 | Zinser, Jr. ............... | G10L 19/26 704/206 |
| 2011/0206209 | A1 * | 8/2011 | Ojala .................... | G10L 19/008 381/1 |
| 2012/0253798 | A1 | 10/2012 | Walters et al. | |

FOREIGN PATENT DOCUMENTS

| | | |
|---|---|---|
| EP | 1339256 A2 | 8/2003 |
| EP | 1448016 A1 | 8/2004 |
| EP | 2463856 A1 | 6/2012 |
| GB | 2453118 A | 4/2009 |
| WO | WO 2008/041730 A1 | 4/2008 |

* cited by examiner

*Primary Examiner* — Muhammad N Edun
(74) *Attorney, Agent, or Firm* — Birch, Stewart, Kolasch & Birch, LLP (57) ABSTRACT

An audio processing device comprises a multitude of electric input signals, each electric input signal being provided in a digitized form, and a control unit receiving said digitized electric input signals and providing a resulting enhanced signal. The control unit is configured to determine the resulting enhanced signal from said digitized electric input signals, or signals derived therefrom, according to a predefined scheme.

21 Claims, 7 Drawing Sheets

METHOD OF REDUCING UN-CORRELATED NOISE IN AN AUDIO PROCESSING DEVICE

TECHNICAL FIELD

The present application relates to an audio processing device, e.g. a hearing aid, such as a headset or a hearing instrument. The application relates in particular to the minimization in an audio signal of un-correlated noise signal components, e.g. originating from wind noise or microphone noise. The disclosure relates specifically to an audio processing device comprising a multitude of electric input signals.

The application furthermore relates to a method of operating an audio processing device and to the use of an audio processing device.

The application further relates to a data processing system comprising a processor and program code means for causing the processor to perform at least some of the steps of the method.

Embodiments of the disclosure may e.g. be useful in applications such as hearing aids, headsets, ear phones, active ear protection systems, handsfree telephone systems, mobile telephones, public address systems, recording systems, etc.

BACKGROUND

The following account of the prior art relates to one of the areas of application of the present application, hearing aids.

Detection of wind noise and subsequent minimization of its influence on a target signal, e.g. in a hearing aid, such as a head set or a hearing instrument, has been dealt with in a number publications. EP1448016A1 deals for example with a device for detecting the presence of wind noise in an array of microphones. The microphones each generate their time dependant signals, which are fed to a signal processing device providing one or more output signals. The signal processing device has means for generating a time dependant cross correlation function between a first and a second microphone signal and, means for generating a signal corresponding to a time dependant auto correlation function of either the first or the second of the microphone signals. Further the signal processing device is configured to detect a condition that the auto correlation function is substantially higher than the cross correlation function, which is indicative of the presence of wind noise.

US20120253798A1 deals with an arrangement of two microphones where one is multiplied by a factor $\alpha$, the other by $1-\alpha$, and the resulting signals are summed, and wherein $\alpha$ is determined by an adaptive filter for computing an updated value of $\alpha$ to minimize the energy of the summed signal, the updated value of $\alpha$ based on the summed signal and the first and second input signals.

GB2453118A deals with an apparatus for suppression of wind noise in multi-microphone systems, e.g. for generating a speech audio signal from multiple microphones with suppressed wind noise. A combine processor generates combined subband signals from first and second microphone signals split into first and second frequency domain subbands by, for each subband, selecting a subband magnitude for the combined subband signal as a lowest magnitude of a subband magnitude for the first frequency domain subband signal and a subband magnitude for the second frequency domain subband signal.

WO2008041730A1 deals with a method of detecting wind noise including calculating a correlation coefficient between two microphone signals and a number of specific parameters of the two signals.

EP1339256A2 deals with a microphone signal connected to a controllable high pass filter. The control input of the high-pass filter is generated via a statistics evaluating unit, which continuously monitors the behavior of the input signal during a predetermined amount of time. The high-pass filter characteristic is adjusted so as to minimize the energy of the output of the HP-filter.

SUMMARY

The present disclosure relates in particular to the processing of signals that are stochastic and uncorrelated across the multitude of input signals, e.g. from an array of microphones (and possible beam formers). Such signals may e.g. include wind noise. The present disclosure relates in a particular embodiment to the selection of a best source of the input signal in a time/frequency multiplexed domain, e.g. to minimize wind noise or other uncorrelated signals (e.g. stochastic noise) in the resulting signal.

An object of the present application is to provide an improved scheme for processing audio signals.

Objects of the application are achieved by the invention described in the accompanying claims and as described in the following.

Figure 1A:
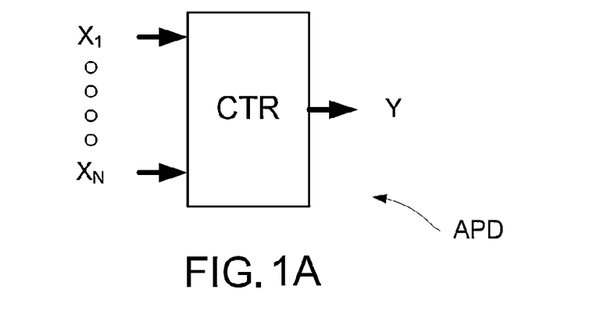
FIGS. 1A-1C schematically show three embodiments of an audio processing device according to the present disclosure.

An Audio Processing Device:

In an aspect, the present disclosure relates to an audio processing device comprising a multitude N (N>1) of inputs, e.g. from an array of microphones or a combination of other and/or different input transducers each providing an electric input signal $X_i$ (i=1, 2, ..., N) representing an acoustic signal of the environment of the audio processing device, and providing a resulting, processed signal Y (cf. e.g. FIG. 1A).

In an aspect, an object of the application is achieved by an audio processing device comprising
   a multitude of electric input signals, each electric input signal being provided in a digitized form, and
   a control unit receiving said digitized electric input signals and providing a resulting enhanced signal, wherein the control unit is configured to determine the resulting enhanced signal from said digitized electric input signals, or signals derived therefrom, according to a predefined scheme.

This has the advantage of allowing a minimization in a resulting audio signal of undesired signal components of a sound field.

The term 'resulting enhanced signal' is in the present context taken to mean a resulting signal, e.g. a modified or an improved signal.

The term 'predefined scheme' (for determining a resulting enhanced signal from the digitized electric input signals) is in the present context taken to include a criterion that is defined in advance of the use of the audio processing device, such criterion being related to the digitized electric input signals.

In an embodiment, the predefined scheme comprises a criterion based on the magnitude (or magnitude squared) of the respective electric input signals or a signal derived therefrom. In an embodiment, the predefined scheme comprises a criterion to provide a resulting enhanced signal (at a given time and/or frequency) having the smallest magnitude as selected among the multitude of electric input signals.

In an embodiment, the predefined scheme comprises a criterion for minimizing the energy of a resulting enhanced signal.

In an embodiment, the criterion for minimizing the energy is achieved by, at each point in time, selecting the electric input signal that—at that point in time—contains the least energy.

The electric input signals are provided in digitized form (the digitized signal comprising sample values of an analogue input signal at regularly spaced, distinct time instances). In an embodiment, the resulting enhanced signal is determined as an assembly of samples selected among the available electric input signals (or signals derived therefrom), each sample of the enhanced signal at a specific point in time representing (being taken from) the electric input signal that at that time has the lowest energy (magnitude).

In an embodiment, a time frame is defined, each time frame containing a predefined number of samples. In an embodiment, the minimization of energy in the resulting enhanced signal is performed on a time frame basis in that the resulting enhanced signal is determined as an assembly of time frames (instead of samples) selected among the available electric input signals (or signals derived therefrom).

In an embodiment, the predefined scheme comprises a criterion resulting in the selection of the contents of a given time-frequency bin (k,m) of one of the respective electric input signals (or a signal derived therefrom) for being used in the corresponding time-frequency bins (k,m) of the enhanced signal.

Figure 6A:
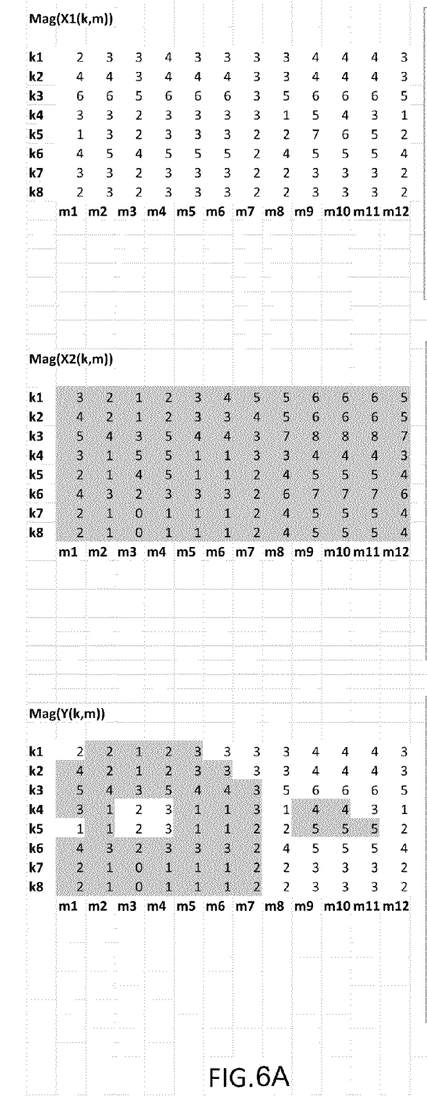
FIGS. 6A-6B show illustrative examples of time-frequency representations of first and second electric input signals and a resulting enhanced output signal according to an embodiment of the present disclosure.
Figure 6B:
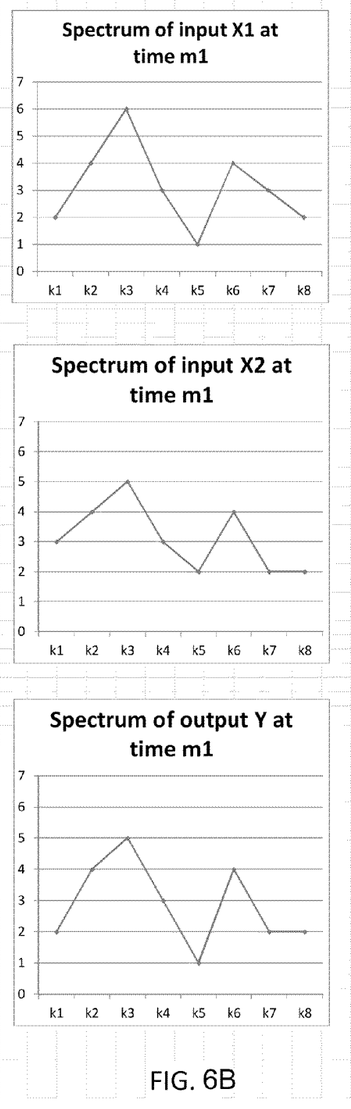

In a preferred embodiment, the predefined scheme comprises that the content of a given time-frequency bin (k,m) of the enhanced signal is determined from the content of the time-frequency bin (k,m) of the electric input signal comprising the least energy (e.g. has the smallest magnitude among the available input signals), cf. e.g. FIG. 6. In a signal comprising wind noise, such scheme utilizes that the source signal containing the least energy also will contain least wind noise.

Alternatively, the predefined scheme comprises selecting the time frequency units having the largest signal to noise ratio (SNR). This has the advantage of basically removing the need to prefer one source over the other.

The input signals to the audio processing device may be presented in the (time-) frequency domain or converted from the time domain to the (time-) frequency domain by appropriate functional units, e.g. included in the audio processing device. An audio processing device according to the present disclosure may e.g. comprise a multitude of time to time time-frequency conversion units (e.g. one for each input signal that is not otherwise provided in a time-frequency representation, cf. e.g. FIG. 1B) to provide each input signal $X_i(k,m)$ (i=1, 2, ..., N) in a number of frequency bands k and a number of time instances m (the entity (k,m) being defined by corresponding values of indices k and m being termed a TF-bin or DFT-bin or TF-unit, cf. e.g. FIG. 3B). The audio processing device comprises a control or signal processing unit that receives time-frequency representations of the input signals and provides a time-frequency representation of a resulting, enhanced signal. The control unit is configured to determine the content of a given time-frequency bin (k,m) of the enhanced signal from the contents of corresponding TF-bins of the time-frequency representations of one or more of the electric input signals according to a predefined scheme.

In an embodiment, the phase of the resulting enhanced signal is determined by the origin of the signal at a particular time. In other words, the resulting enhanced signal comprises magnitude and phase from the input signal (or a time frequency unit of the input signal) that is selected at a given point in time (that fulfils the predetermined scheme). Alternatively, the phase of the resulting enhanced signal may be synthesized (e.g. randomized) or smoothed to avoid large changes in phase from time instance to time instance (and/or from frequency band to frequency band).

Preferably, the electric input signals $X_i$ provide different representations (e.g. picked up at different locations and/or by different transducer means) of the same sound field constituting the current acoustic environment of the audio processing device.

In an embodiment, the sound field comprises one or more speech signals. In an embodiment, a specific speech signal constitutes a target signal of the user wearing the audio processing device.

An electric input signal $X_i(k,m)$ (i=1, 2, ..., N) may represent a signal from an input transducer, e.g. a microphone (e.g. a normal microphone or a vibration sensing bone conduction microphone), or an accelerometer, or a wireless receiver.

In an embodiment, an electric input signal $X_i$ is an omni-directional signal.

In an embodiment, an electric input signal $X_i$ is the result of a combination of two or more signals, e.g. a linear combination. In an embodiment, an electric input signal $X_i$ is an output from a processing algorithm (in the sense that the electric input signal $X_i$ is the resulting signal after having been subject to a processing algorithm, e.g. a noise reduction or compression or directional algorithm).

The audio processing device may comprise a directional algorithm for combining two or more of the input signals (e.g. signals from two or more microphones), such directionality algorithm being alternatively referred to as beam forming in the present application. In an embodiment, an electric input signal $X_i$ is a directional (beamformed) signal (e.g. resulting from a (e.g. weighted) combination of at least two omni-directional signals).

In an embodiment, the directional algorithm is configured to identify the direction (from the present location of the audio processing device) to a sound source comprising a target speech signal in a given sound field.

In an embodiment, the audio processing device comprises a microphone system comprising at least two microphones for converting a sound field to respective time variant electric input signals and at least two time to time time-frequency conversion units, one for each microphone, to provide time-frequency representations of each electric input signal in a number of frequency bands k and a number of time instances m.

In a situation where individual input signals (e.g. each originating from an omni-directional microphone) are correlated, a directional signal based on such correlated inputs may have a lower energy than each of the individual signals. It will hence—in general—be advantageous to use the directional signal for further processing or presentation to a user. On the other hand, in a situation where individual input signals (or elements or components of the inputs signals) are UN-correlated, e.g. due to contributions from wind or microphone noise, it will in general be advantageous to use one of the non-directional (omni-directional) signals for further processing or presentation to a user.

In an embodiment, the audio processing device comprises at least three electric input signals, first and second electric input signals from two (e.g. omni-directional) microphones and a third electric input signals from a directional algorithm providing a weighted combination of said first and second electric input signals. In an embodiment, the control unit is configured to optimize the directional signal by inserting signal components from the two (e.g. omni-directional) microphones having lower energy than the corresponding signal components of the directional input signal (the third electric input signal).

In a preferred embodiment, the electric input signals are normalized. This has the advantage that the signal contents of the individual signals can be readily compared. In an embodiment, the audio processing device comprises a normalization filter operationally connected to an electrical input, the normalization filter being configured to have a transfer function $H_N(f)$, which makes the source providing the electric input signal in question comparable and interchange able with the other sources. The normalization filter is preferably configured to allow a direct comparison of the input signals and a smooth exchange of signal components (e.g. TF-units) between the input signals (without creating significant discontinuities). A normalization can e.g. compensate for a constant level difference between two electric input signals (e.g. due to the location of the two source input transducers providing the input signals relative to the current sound source(s)). In an embodiment, the normalization filter comprises an adaptive filter.

In an embodiment, a method of normalizing N electric input signals comprises a) Select a reference source input signal (e.g. the signal assumed to be most reliable), e.g. signal $X_1$, b) for each of the other source input signals $X_i$, i=2, ..., N, calculate the difference in magnitude over frequency to the reference (e.g. for a common time period of the signals and/or for respective signals averaged over a certain time), and c) scale each source by multiplication with a (possibly complex) correction value.

In an embodiment, the control unit comprises a combination unit allowing a weight P to be applied to at least one of the electric input signals (or to a signal derived therefrom). In an embodiment the weight P is dependent on frequency. The (possibly frequency dependent $P_i(f)$, i=1, 2, ..., N, f being frequency) weighting factors provide a possibility to prefer one input signal (or a specific frequency range of an input signal) over another. If, e.g., a given source providing one of the electric inputs signals is known to have a specific dependence on a specific parameter (e.g. a parameter of the current acoustic environment, e.g. the general level of wind noise or), the control unit can be configured to take this into account by modifying P(f) accordingly.

In an embodiment, the relative size of weights $P_q(f)$ and $P_j(f)$ for input signal q and j, respectively, is influenced by the location of the input transducers that provide the electric input signals q and j, respectively, relative to sound sources of the current sound field.

In an embodiment, the audio processing unit comprises a wind noise detector for providing an (preferably frequency dependent) estimate of the amount of wind noise present at a specific point in time (e.g. at a specific location, or in a specific input signal). In an embodiment, the wind noise detector is configured to detect any un-correlated noise (e.g. wind noise, microphone, noise etc.).

In an embodiment, a weighting factor $P_i(f)$ of the $i^{th}$ electric input signal (or a signal derived therefrom, i=1, 2, ..., N) is modified in dependence of the estimated amount of wind noise. In an embodiment, a weighting factor P(f) of an input signal that represents a directional microphone signal is different at different frequencies (e.g. to compensate for a non linear wind noise dependence of the directional signal).

In an embodiment, a weighting factor $P_i(f)$ of an input signal is adaptively determined dependent on an output from a detector, e.g. an environment detector, e.g. a wind noise detector.

In an embodiment, the weighting factors are used $P_i(f)$ to select the signal from only one source, e.g. source j (by setting $P_i(f)=0$ for all other signals (for i≠j)).

In an embodiment, the audio processing device comprises an artifact detector providing an artifact measure indicative of the presence of 'fluctuating gains', which may be a source of artifacts introduced by a processing algorithm (e.g. the present algorithm for reducing un-correlated noise in an audio signal). An example of such artifact detector is disclosed in EP2463856A1.

The term 'artifact' is in the present context of audio processing taken to mean elements of an audio signal that are introduced by signal processing (digitalization, noise reduction, compression, etc.) that are in general not perceived as natural sound elements, when presented to a listener. The artifacts are often referred to as musical noise, which are due to random spectral peaks in the resulting signal. Such artifacts sound like short pure tones.

In an embodiment, the activation or deactivation of the current scheme for minimizing un-correlated signal components (e.g. wind noise) in an audio signal is influenced by the artifact measure. In other words, the control unit is configured to disregard the proposal of the predefined scheme, if the artifact measure indicates that the artifact produced by the noise minimization algorithm is audible (i.e. worse than the benefit achieved by lowering the noise floor).

In an embodiment comprising two microphone input signals and a directional input, the energy minimization algorithm according to the present disclosure is used to remove un-correlated signal components in the directional signal. In an embodiment, the control unit is configured to maintain the directional signal in cases where the artifacts created by the minimization algorithm are audible. This can e.g. be implemented by lowering the weighting factor P for the directional signal (third electric input signal) compared to the weighting factors of the two microphone input signals (first and second electric input signals). In an embodiment, the weighting factors $P_1(f)=P_2(f)=1$ and $P_3(f)<1$.

In an embodiment, the audio processing device is adapted to provide a frequency dependent gain to compensate for a hearing loss of a user. In an embodiment, the audio processing device comprises a signal processing unit for enhancing the input signals and providing a processed output signal.

In an embodiment, the audio processing device comprises an output transducer for converting an electric signal to a stimulus perceived by the user as an acoustic signal. In an embodiment, the output transducer comprises a number of electrodes of a cochlear implant or a vibrator of a bone conducting hearing device. In an embodiment, the output transducer comprises a receiver (speaker) for providing the stimulus as an acoustic signal to the user.

In an embodiment, the audio processing device comprises an antenna and transceiver circuitry for wirelessly receiving a direct electric input signal from another device, e.g. a communication device or another audio processing device. In an embodiment, the audio processing device comprises a (possibly standardized) electric interface (e.g. in the form of a connector) for receiving a wired direct electric input signal from another device, e.g. a communication device or another audio processing device. In an embodiment, the direct electric input signal represents or comprises an audio signal and/or a control signal and/or an information signal.

In an embodiment, the communication between the audio processing device and the other device is in the base band (audio frequency range, e.g. between 0 and 20 kHz). Preferably, communication between the audio processing device and the other device is based on some sort of modulation at frequencies above 100 kHz. Preferably, frequencies used to establish communication between the audio processing device and the other device is below 50 GHz, e.g. located in a range from 50 MHz to 50 GHz, e.g. above 300 MHz, e.g. in an ISM range above 300 MHz, e.g. in the 900 MHz range or in the 2.4 GHz range.

In an embodiment, the audio processing device is portable device, e.g. a device comprising a local energy source, e.g. a battery, e.g. a rechargeable battery.

In an embodiment, the audio processing device comprises a forward or signal path between an input transducer (microphone system and/or direct electric input (e.g. a wireless receiver)) and an output transducer. In an embodiment, the signal processing unit is located in the forward path. In an embodiment, the signal processing unit is adapted to provide a frequency dependent gain according to a user's particular needs. In an embodiment, the audio processing device comprises an analysis path comprising functional components for analyzing the input signal (e.g. determining a level, a modulation, a type of signal, an acoustic feedback estimate, etc.). In an embodiment, some or all signal processing of the analysis path and/or the signal path is conducted in the frequency domain. In an embodiment, some or all signal processing of the analysis path and/or the signal path is conducted in the time domain.

In an embodiment, an analogue electric signal representing an acoustic signal is converted to a digital audio signal in an analogue-to-digital (AD) conversion process, where the analogue signal is sampled with a predefined sampling frequency or rate $f_s$, $f_s$ being e.g. in the range from 8 kHz to 80 kHz (adapted to the particular needs of the application, e.g. 48 kHz) to provide digital samples $x_n$ (or x[n]) at discrete points in time $t_n$ (or n), each audio sample representing the value of the acoustic signal at $t_n$ by a predefined number $N_s$ of bits, $N_s$ being e.g. in the range from 1 to 64 bits, e.g. 16 or 24 bits. A digital sample x has a length in time of $t_s=1/f_s$, e.g. 50 µs, for $f_s=20$ kHz. In an embodiment, a number of audio samples are arranged in a time frame. In an embodiment, a time frame comprises 64 audio data samples. Other frame lengths may be used depending on the practical application. A frame length may e.g. be of the order of 2 to 20 ms, e.g. 3.2 ms or 3.75 ms (e.g. Bluetooth) or 5 ms or 7.5 ms (e.g. Bluetooth) 10 ms (e.g. DECT).

In an embodiment, the audio processing devices comprise an analogue-to-digital (AD) converter to digitize an analogue input with a predefined sampling rate, e.g. 20 kHz. In an embodiment, the audio processing devices comprise a digital-to-analogue (DA) converter to convert a digital signal to an analogue output signal, e.g. for being presented to a user via an output transducer.

In an embodiment, the audio processing device, e.g. the microphone unit, and or the transceiver unit comprise(s) a TF-conversion unit for providing a time-frequency representation of an input signal. In an embodiment, the time-frequency representation comprises an array or map of corresponding complex or real values of the signal in question in a particular time and frequency range. In an embodiment, the TF conversion unit comprises a filter bank for filtering a (time varying) input signal and providing a number of (time varying) output signals each comprising a distinct frequency range of the input signal. In an embodiment, the TF conversion unit comprises a Fourier transformation unit for converting a time variant input signal to a (time variant) signal in the frequency domain. In an embodiment, the frequency range considered by the audio processing device from a minimum frequency $f_{min}$ to a maximum frequency $f_{max}$ comprises a part of the typical human audible frequency range from 20 Hz to 20 kHz, e.g. a part of the range from 20 Hz to 12 kHz. In an embodiment, a signal of the forward and/or analysis path of the audio processing device is split into a number NI of frequency bands, where NI is e.g. larger than 5, such as larger than 10, such as larger than 50, such as larger than 100, such as larger than 500, at least some of which are processed individually. In an embodiment, the audio processing device is/are adapted to process a signal of the forward and/or analysis path in a number NP of different frequency channels (NP≤NI). The frequency channels may be uniform or non-uniform in width (e.g. increasing in width with frequency), overlapping or non-overlapping.

In an embodiment, the audio processing device comprises a level detector (LD) for determining the level of an input signal (e.g. on a band level and/or of the full (wide band) signal). The input level of the electric microphone signal picked up from the user's acoustic environment is e.g. a classifier of the environment.

In a particular embodiment, the audio processing device comprises a voice activity detector (VAD) for determining whether or not an input signal comprises a voice signal (at a given point in time). This has the advantage that time segments of the electric microphone signal comprising human utterances (e.g. speech) in the user's environment can be identified, and thus separated from time segments only comprising other sound sources (e.g. naturally or artificially generated noise, e.g. wind noise or microphone noise).

In an embodiment, the audio processing device comprises a signal to noise ratio detector (estimator). SNR estimation may e.g. be performed in combination with a voice activity detector (VAD), as indicated above.

In an embodiment, the audio processing device comprises a detector of the presence of a predefined amount of un-correlated signal components in the current sound field surrounding the audio processing device. In an embodiment, the audio processing device comprises a wind noise detector, a correlation detector, an auto-correlation detector or a combination thereof.

In an embodiment, the activation or deactivation of the current scheme for minimizing un-correlated signal components (e.g. wind noise) in an audio signal is dependent on a control signal from the detector(s).

In an embodiment, the audio processing device comprises an acoustic (and/or mechanical) feedback suppression system. In an embodiment, the audio processing device further comprises other relevant functionality for the application in question, e.g. compression, noise reduction, etc.

In an embodiment, the audio processing device comprises a listening device, e.g. a hearing aid, or a communication device, e.g. a cell phone. In an embodiment, the hearing aid comprises a headset. In an embodiment, the hearing aid comprises a hearing instrument, such as a hearing instrument adapted for being located at the ear or fully or partially in the ear canal of a user. In an embodiment, the hearing aid comprises an earphone, an ear protection device or a combination thereof.

Use:

In an aspect, use of an audio processing device as described above, in the 'detailed description of embodiments' and in the claims, is moreover provided. In an embodiment, use is provided in an audio system comprising a mixture of one or more target signals and one or more noise signals, the one or more noise signals comprising un-correlated signal components, e.g. wind noise. In an embodiment, use is provided in a system comprising one or more hearing instruments, headsets, ear phones, active ear protection systems, etc., e.g. in handsfree telephone systems, teleconferencing systems, public address systems, karaoke systems, classroom amplification systems, etc.

A Method:

In an aspect, a method of operating an audio processing device is furthermore provided by the present application, the method comprises providing a multitude of electric input signals, each being provided in a digitized form;

providing a resulting enhanced signal based on said digitized electric input signals; and determining the resulting enhanced signal from said digitized electric input signals, or signals derived therefrom, according to a predefined scheme.

It is intended that some or all of the structural features of the device described above, in the 'detailed description of embodiments' or in the claims can be combined with embodiments of the method, when appropriately substituted by a corresponding process and vice versa. Embodiments of the method have the same advantages as the corresponding devices.

A Computer Readable Medium:

In an aspect, a tangible computer-readable medium storing a computer program comprising program code means for causing a data processing system to perform at least some (such as a majority or all) of the steps of the method described above, in the 'detailed description of embodiments' and in the claims, when said computer program is executed on the data processing system is furthermore provided by the present application. In addition to being stored on a tangible medium such as diskettes, CD-ROM-, DVD-, or hard disk media, or any other machine readable medium, and used when read directly from such tangible media, the computer program can also be transmitted via a transmission medium such as a wired or wireless link or a network, e.g. the Internet, and loaded into a data processing system for being executed at a location different from that of the tangible medium.

A Data Processing System:

In an aspect, a data processing system comprising a processor and program code means for causing the processor to perform at least some (such as a majority or all) of the steps of the method described above, in the 'detailed description of embodiments' and in the claims is furthermore provided by the present application.

Further objects of the application are achieved by the embodiments defined in the dependent claims and in the detailed description of the invention.

As used herein, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element or intervening elements may be present, unless expressly stated otherwise. Furthermore, "connected" or "coupled" as used herein may include wirelessly connected or coupled. As used herein, the term "and/or" includes any and all combinations of one or more of the associated listed items. The steps of any method disclosed herein do not have to be performed in the exact order disclosed, unless expressly stated otherwise.

BRIEF DESCRIPTION OF DRAWINGS

The disclosure will be explained more fully below in connection with a preferred embodiment and with reference to the drawings in which:

FIGS. 2A-2C show three embodiments of an audio processing device according to the present disclosure, FIGS. 3A-3B schematically show a conversion of a signal in the time domain to the time-frequency domain, FIG. 3A illustrating a time dependent sound signal (amplitude versus time) and its sampling in an analogue to digital converter, FIG. 3B illustrating a resulting 'map' of time-frequency units after a Fourier transformation of the sampled signal.

The figures are schematic and simplified for clarity, and they just show details which are essential to the understanding of the disclosure, while other details are left out.

Further scope of applicability of the present disclosure will become apparent from the detailed description given hereinafter. However, it should be understood that the detailed description and specific examples, while indicating preferred embodiments of the disclosure, are given by way of illustration only. Other embodiments may become apparent to those skilled in the art from the following detailed description.

DETAILED DESCRIPTION OF EMBODIMENTS

Figure 1B:
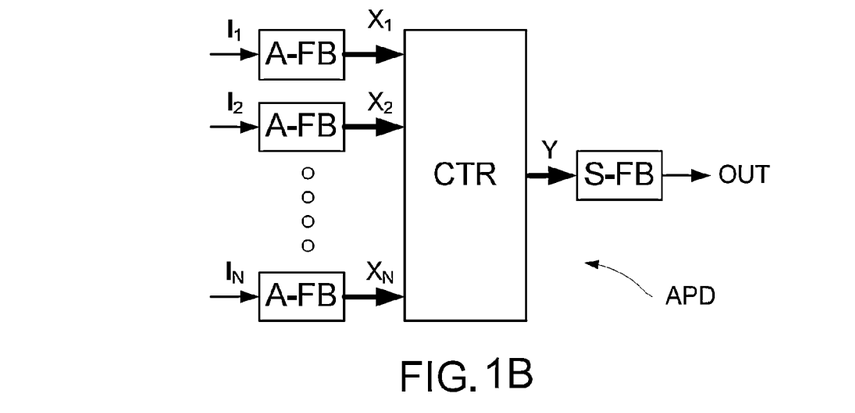
Figure 1C:
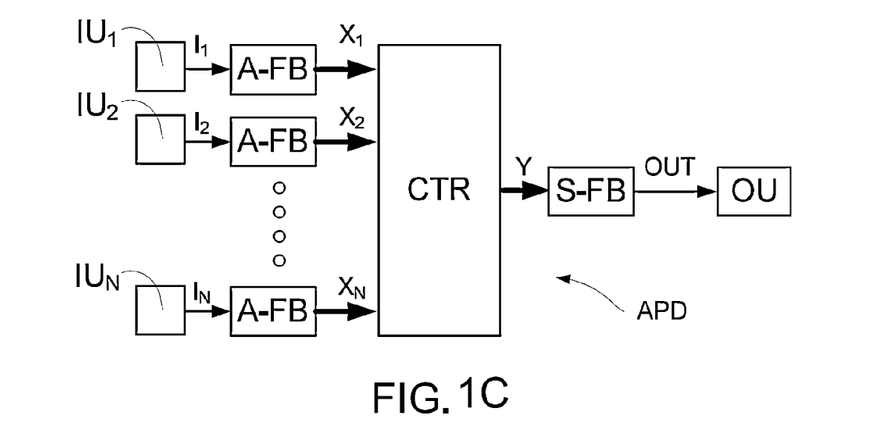

FIGS. 1A-1C show three embodiments of an audio processing device according to the present disclosure.

In a first basic embodiment, the audio processing device (APD) of FIG. 1A comprises a multitude of electric input signals $X_1, \ldots, X_N$, (where $N \geq 2$), each electric input signal being provided in a digitized form, and a control unit (CTR) receiving the digitized electric input signals and providing a resulting enhanced signal Y. The control unit (CTR) is configured to determine the resulting enhanced signal Y from the digitized electric input signals $X_1, \ldots, X_N$, or signals derived therefrom, according to a predefined scheme, e.g. by minimizing the energy of the enhanced signal Y at predefined points in time (e.g. on a sample or a time frame or a time-frequency unit basis).

In a second basic embodiment, the audio processing device (APD) of FIG. 1B comprises a multitude of input signals $I^1, I_2, \ldots, I_N$, (where $N \geq 2$), each input signal $I_i$ being operationally connected to an analysis filter bank (A-FB) providing a time-frequency representation $X_i$ of the input signal (e.g. comprising (complex) values of the input signal in a number of frequency bands k and at a number of time instances m). The control unit (CTR) is configured to determine the resulting enhanced signal Y from the time-frequency representation of the electric input signals $X_1, X_2, \ldots, X_N$, or signals derived therefrom, according to a predefined scheme. The resulting enhanced signal Y is here assumed to be provided in a time—frequency representation and is here operationally connected to a synthesis filter bank (S-FB) providing the resulting enhanced signal as a time domain signal OUT, which may be processed further in subsequent signal processing units.

The third basic embodiment of an audio processing device (APD) according to the present disclosure as shown in FIG. 1C comprises the same functional elements as described in connection with FIG. 1B. Additionally, the embodiment of FIG. 1C comprises input units $IU_1, IU_2, \ldots, IU_N$, providing the input signals $I_1, I_2, \ldots, I_N$. Input units $IU_1, IU_2, \ldots, IU_N$ in general provide (electric) input signals ($I_1, I_2, \ldots, I_N$) representing an audio signal (i.e. comprise frequencies in the audible frequency range (e.g. ≤20 kHz)). Input units $IU_1, IU_2, \ldots, IU_N$ can e.g. comprise one or more input transducers, e.g. microphones for picking up an acoustic sound signal and/or transceivers for (wirelessly or wired) receiving electric or electromagnetic signals comprising audio, and/or be a signal input from a processing algorithm having been applied to an audio signal. In the embodiment of FIG. 1C, the time domain signal OUT is operationally connected to an output unit (OU). The output unit (OU) can e.g. be an output transducer, e.g. for converting the electric output signal OUT to a stimulus perceived by a user as sound. Such output transducer can e.g. include a) a receiver/speaker for converting the electric signal to an acoustic sound signal, b) a vibrator of a bone conducting hearing instrument for converting the electric signal to mechanical vibrations to the user's inner ears through the bone structure of the user's head, or c) one or more electrodes of a cochlear implant for transferring electric signals directly or indirectly to the cochlear nerve of the user. Alternatively of additionally, the output unit can include a transceiver for transmitting the electric output signal to another device.

The embodiments of an audio processing device shown in FIG. 1A, 1B, or 1C may e.g. comprise a detector (e.g. embodied in or external to control unit CTR) configured to influence the formation of the enhanced signal Y. An output of such detector may e.g. influence the weighting of one or more of the electric input signals $X_i$ in the formation of the enhanced signal Y.

Figure 2A:
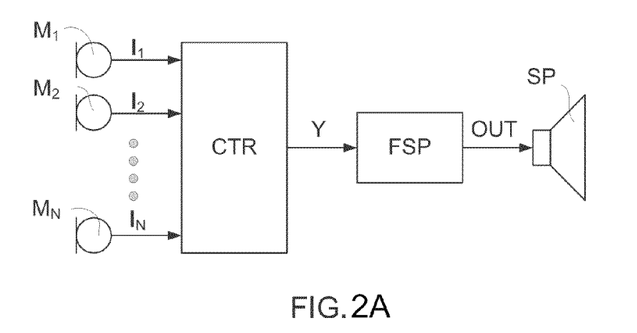
Figure 2B:
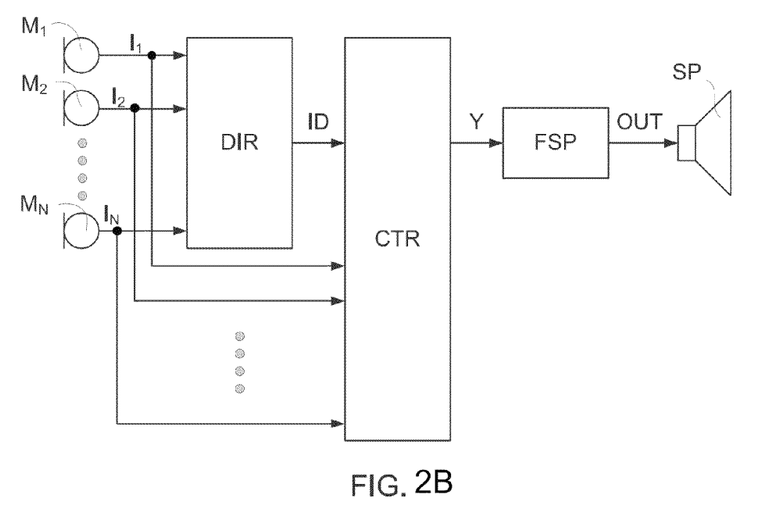
Figure 2C:
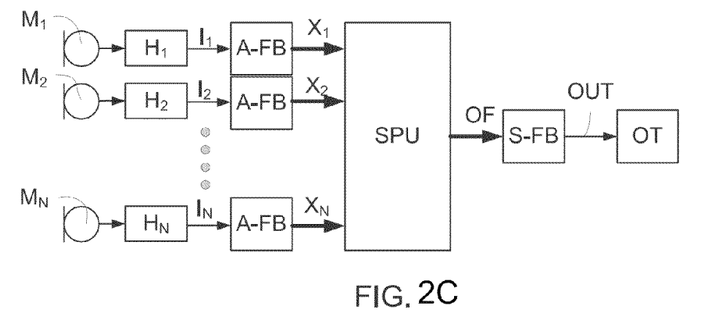

FIGS. 2A-2C show three embodiments of an audio processing device according to the present disclosure. The embodiments of an audio processing device illustrated in FIGS. 2A-2C can e.g. represent a listening device, e.g. a hearing aid, e.g. a (part of a) headset or a hearing instrument.

The embodiment of an audio processing device of FIG. 2A comprises microphone units $M_1, M_2, \ldots, M_N$ each picking up a version of the sound field around the audio processing device and converting the sound signal to a digitized (electric) input signal $I_i$, i=1, 2, ..., N. The microphone units $M_1, M_2, \ldots, M_N$ are assumed to each comprise analogue to digital (AD) conversion units to convert an analogue electric signal to a digitized electric signal. The control unit (CTR) receives the digitized electric input signals $I_1, I_2, \ldots, I_N$ and provides a resulting enhanced signal Y, wherein un-correlated signal components are minimized. This signal is fed to processing unit (FSP) for additional signal processing, e.g. further noise reduction, application of frequency dependent gain, feedback cancellation or echo cancelling, etc. The output OUT of the processing unit is in the embodiment of FIG. 2A fed to a speaker unit (SP) for converting the electric output signal OUT to an output sound for being provided to a user. The speaker unit (SP) is e.g. embodied in an ear piece located at a user's ear or in a user's ear canal.

The embodiment of an audio processing device of FIG. 2B comprises the same elements as the embodiment of FIG. 2A. Additionally, the audio processing device of FIG. 2B comprises a directional algorithm embodied in directional unit (DIR), which is operationally connected to digitized (electric) input signal $I_i$, i=1, 2, ..., N. Directional unit (DIR) provides a directional signal ID emulating a directional microphone having a directional characteristic providing increased sensitivity in particular directions and decreased sensitivity in other directions, thereby attenuating noise (and possible target signals) from those (other) directions. The directional signal ID, which is formed as a weighted combination of input signals $I_i$, i=1, 2, ..., N, is operationally connected to control unit CTR. The control unit (CTR) thus receives the digitized electric input signals $I_1, I_2, \ldots, I_N$ and additionally directional signal ID as inputs and provides a resulting enhanced signal Y based thereon. In the embodiment of FIG. 2B, the directional signal ID is assumed to have a lower amount of un-correlated noise, e.g. wind noise (at least in directions of decreased sensitivity of the directional characteristic), and the task of control unit CTR can be seen as optimizing the directional signal by inserting signal components from the individual microphones (among signals $I_1, I_2, \ldots, I_N$) having lower energy (e.g. magnitude), and thus lower noise, than the corresponding signal components of the directional input signal ID. The resulting enhanced signal Y, is operationally connected to processing unit (FSP) for additional signal processing as described in connection with FIG. 2A.

The embodiment of an audio processing device of FIG. 2C comprises a multitude of microphone units $M_1, M_2, \ldots, M_N$ each picking up a version of the sound field around the audio processing device and converting the sound signal to an (electric) input signal. Each microphone $M_i$ is operationally connected to a normalization filter $H_i$ (i=1, 2, ..., N), each being configured to have a transfer function $H_i(f)$, which makes the source (picked up by microphone $M_i$) providing the (electric) input signal in question comparable and interchange able with the other sources. The normalization filters $H_i$ providing normalized electric input signals $I_i$, are operationally connected to time to time-frequency conversion units (here analysis filter banks, A-FB), whose outputs $X_i$ (comprising a time-frequency representation of corresponding signals $I_i$) are fed to signal processing unit SPU. Signal processing unit (SPU) comprises an algorithm according to the present invention configured to minimize un-correlated noise in a resulting audio signal (Y, not shown in FIG. 2C). The signal processing unit (SPU) may be configured to apply further signal processing to input signals $X_i$ (i=1, 2, ..., N) before or after the application of the noise minimization algorithm according to the present disclosure. Likewise, the resulting enhanced signal Y may be further processed in signal processing unit (SPU) before a processed output signal OF (assumed to be in a time-frequency representation) is operationally connected to time-frequency to time conversion unit (here synthesis filter bank S-FB) to provide an output signal OUT in the time domain. Output signal OF is operationally connected to output transducer, OT. Output transducer OT may be embodied in various ways as e.g. indicated in connection with FIG. 10.

Figure 3A:
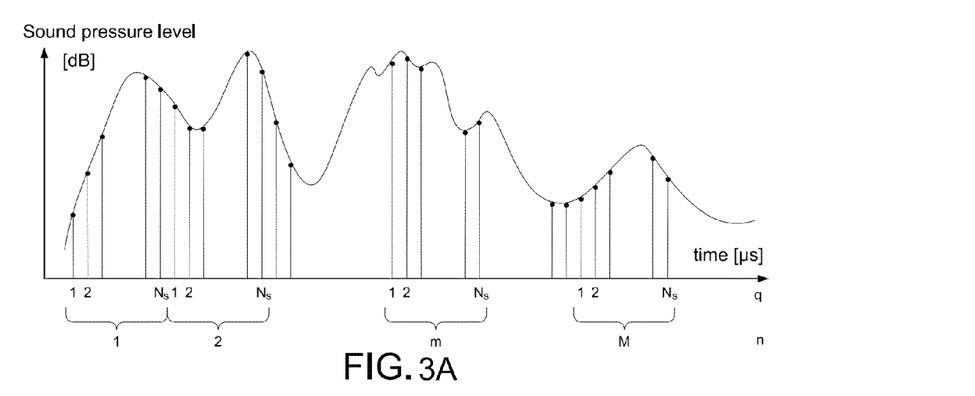
Figure 3B:
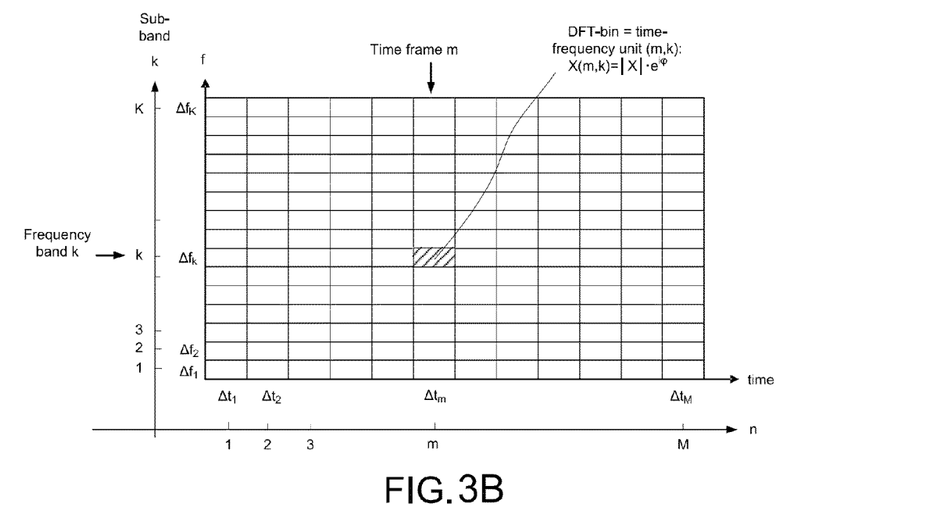

FIGS. 3A-3B schematically show a conversion of a signal in the time domain to the time-frequency domain, FIG. 3A illustrating a time dependent sound signal (amplitude versus time) and its sampling in an analogue to digital converter, FIG. 3B illustrating a resulting 'map' of time-frequency units after a Fourier transformation of the sampled signal. FIG. 3A illustrates a time dependent sound signal x(t) (amplitude (SPL [dB]) versus time (t)), its sampling in an analogue to digital converter and a grouping of time samples in frames, each comprising $N_s$ samples. The graph showing a sound pressure level in dB versus time (solid line in FIG. 3A) may e.g. represent the time variant analogue electric signal provided by an input transducer, e.g. a microphone, before being digitized by an analogue to digital conversion unit. FIG. 3B illustrates a 'map' of time-frequency units resulting from a Fourier transformation (e.g. a discrete Fourier transform, DFT) of the input signal of FIG. 3A, where a given time-frequency unit (m,k) corresponds to one DFT-bin and comprises a complex value of the signal X(m,k) in question (X(m, k)=|X|·$e^{j\Phi}$, |X|=magnitude and $\phi$=phase) in a given time frame m and frequency band k. In the following, a given frequency band is assumed to contain one (generally complex) value of the signal in each time frame. It may alternatively comprise more than one value. The terms 'frequency range' and 'frequency band' are used in the present disclosure. A frequency range may comprise one or more frequency bands. The Time-frequency map of FIG. 3B illustrates time frequency units (m,k) for k=1, 2, . . . , K frequency bands and m=1, 2, . . . , M time units. Each frequency band $\Delta f_k$ is indicated in FIG. 3B to be of uniform width. This need not be the case though. The frequency bands may be of different width (or alternatively, frequency channels may be defined which contain a different number of uniform frequency bands, e.g. the number of frequency bands of a given frequency channel increasing with increasing frequency, the lowest frequency channel(s) comprising e.g. a single frequency band). The time intervals $\Delta t_m$ (time unit) of the individual time-frequency bins are indicated in FIG. 3B to be of equal size. This need not be the case though, although it is assumed in the present embodiments. A time unit $\Delta t_m$ is typically equal to the number $N_s$ of samples in a time frame (cf. FIG. 3A) times the length in time $t_s$ of a sample ($t_s$=(1/$f_s$), where $f_s$ is a sampling frequency). A time unit is e.g. of the order of ms in an audio processing system.

Figure 4A:
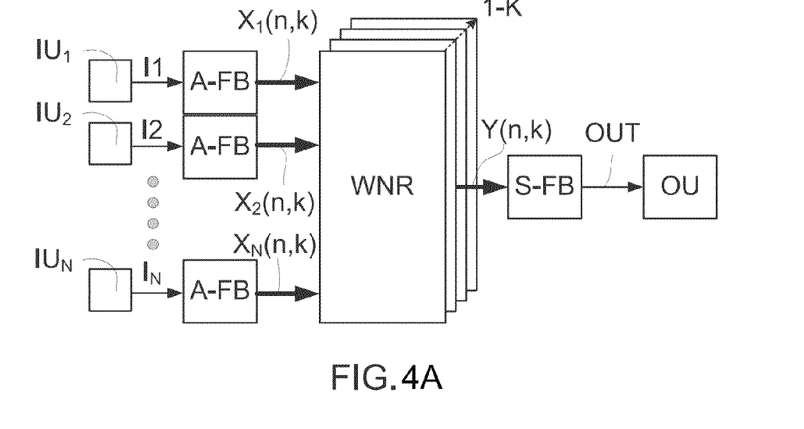
FIGS. 4A-4C show three embodiments of an audio processing device according to the present disclosure where processing is performed in the frequency domain.
Figure 4B:
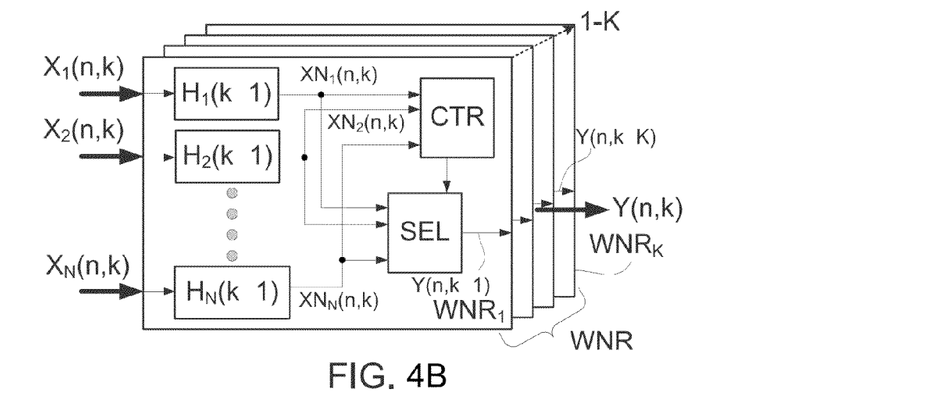
Figure 4C:
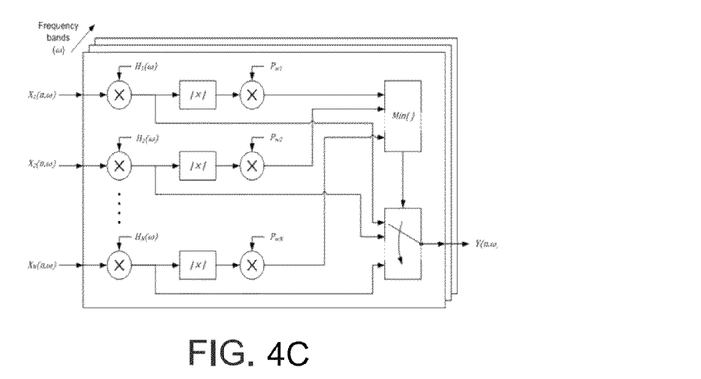

FIGS. 4A-4C show three embodiments of an audio processing device according to the present disclosure where processing is performed in the frequency domain.

The embodiment of an audio processing unit shown in FIG. 4A comprises the same functional units as shown in the embodiment of FIG. 1C. A difference is that control unit CTR in FIG. 1C is denoted WNR in FIG. 4A and that the processing in different frequency bands (or channels) is indicated by the multitude 1, 2, . . . , K of control units (WNR), one for each frequency band k. Each sub-band control unit provides a resulting enhanced signal Y(n,k), n being a time index (termed m above), for a specific frequency band k. FIG. 4B shows an embodiment of control unit WNR of FIG. 4A in more detail (FIG. 4B specifically illustrates sub-band k=1). Each sub-band control unit $WNR_k$ (k=1, 2, . . . , N) comprises normalization filters $H_1, H_2, \ldots, H_N$. Each normalization filter filter of a specific sub-band control unit $WNR_k$ filters an input signal $X_i$(n,k) and provides normalized signals $XN_i$(n, k). The normalization filters $H_i$ (i=1, 2, . . . , N) are configured to allow a direct comparison of the resulting input signals $XN_i$(n,k) and a smooth exchange of signal components (e.g. TF-units (n,k)) between the different input signals $XN_i$(n,k) (without creating significant discontinuities). The normalized signals $XN_i$(n,k) of a given sub-band control unit $WNR_k$ are operationally connected to control unit (CNT) and to selection unit (SEL). The control unit (CNT) of the sub-band control unit in question is configured to determine which of the current time-frequency units (n,k) fulfils a predefined criterion (e.g. has the lowest energy (magnitude)) and provides as an output a select signal S(n,k), which is fed to selection unit (SEL) and controls the selection of the appropriate time-frequency units (n,k) among the N time-frequency units (n,k) of normalized input signals $XN_1$, $XN_2, \ldots, XN_N$. The selection unit (SEL) thereby provides the selected TF-unit as an output in the resulting enhanced signal Y(n,k). The same procedure is followed in all K sub-band control units $WNR_k$ (k=1, 2, . . . , K), thereby providing the resulting enhanced signal Y(n,k).

FIG. 4C shows an alternative example of sub-band control units $WNR_k$ (k=1, 2, . . . , K). In the embodiment of FIG. 4C frequency index k of FIG. 4B is replaced by symbol $\omega$. Normalization filters $H_i$(k) of FIG. 4B are implemented as multipliers with frequency dependent multiplication factors $H_i(\omega)$. The control unit (CNT) of FIG. 4B is implemented in the embodiment of FIG. 4C by units |X| for determining a magnitude of a (real or) complex input signal, a multiplication unit 'x' for applying a weighting factor $P_i(\omega)$ to the input signal in question and a minimization unit (Min{•}) for—at a given point in time n—determining the minimum value among the normalized weighted magnitude signals (|$X_i$(n,$\omega$)·$H_i(\omega)$|·$P_i(\omega)$) from the inputs $X_i$(n,$\omega$). The output of minimization unit (Min{•}) controls the selection unit (equivalent to unit SEL in FIG. 4B), which provides resulting enhanced output signal Y(n,$\omega$).

Figure 5:
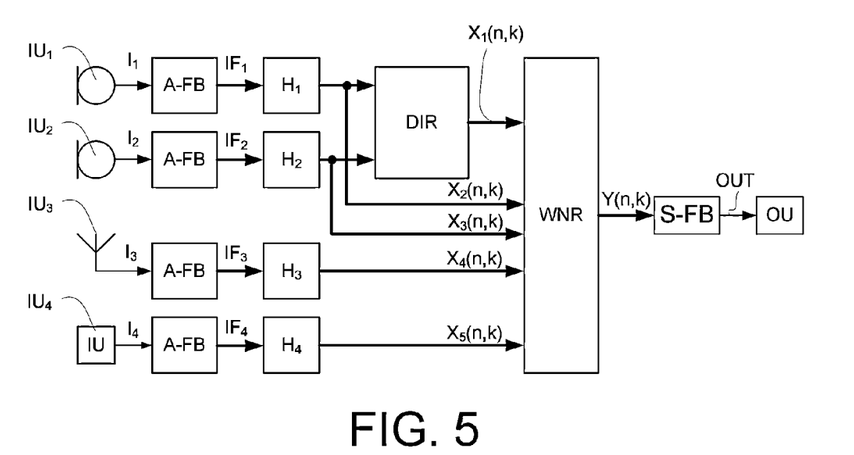
FIG. 5 shows an embodiment of an audio processing device according to the present disclosure where the electric input signals comprise two microphone signals and a directional signal generated from the microphone signals.

FIG. 5 shows an embodiment of an audio processing device according to the present disclosure where the electric input signals comprise two microphone signals and a directional signal generated from the microphone signals. The embodiment of an audio processing device shown in FIG. 5 comprises four input units $IU_1$, $IU_2$, $IU_3$, and $IU_4$, each providing respective digitized electric input signals $I_1$, $I_2$, $I_3$, and $I_4$, each representing an input audio signal. Input units $IU_1$, $IU_2$ are embodied by respective microphone units. Input unit $IU_3$ is embodied by antenna and transceiver circuitry for receiving and (possibly) demodulating an electromagnetic signal representing an audio signal, such audio signal being e.g. picked up by a microphone separately located from the audio processing unit (e.g. in another device, e.g. in a communication device, e.g. a cellular phone, or in a contra-lateral listening device of a binaural listening system, e.g. of a binaural hearing aid system). The fourth Input unit $IU_4$ may be another microphone or any other input transducer (e.g. a vibration sensing bone conduction microphone, or an accelerometer) or input signal as discussed above (e.g. in connection with FIG. 1C). The audio processing device comprises analysis filter banks (A-FB) for providing input signals $I_1$-$I_4$ in a time-frequency representation as signals $IF_1$-$IF_4$. The analogue to digital conversion assumed to have taken place in input units $IU_1$-$IU_4$ may alternatively be included in analysis filter bank units (A-FB). The audio processing device of FIG. 5 further comprises normalization filters $H_1$-$H_4$ as discussed in connection with FIG. 2C and FIGS. 4B-4C. Outputs of normalization filters $H_1$ and $H_2$ are operationally connected to a directional unit (DIR) providing as an output a directional signal $X_1$(n,k). The audio processing device further comprises control unit (WNR) for providing an enhanced signal Y(n,k) from input signals from the directional unit DIR (signal $X_1$(n,k)) and the four normalized audio signals $X_2$(n,k)-$X_5$(n,k). originating from input units $IU_1$-$IU_4$.

In an embodiment, the audio processing device comprises (e.g. embodied in control unit WNR) a detector of the presence of a predefined amount of un-correlated signal components in a given input signal (e.g. each of $X_1$(n,k)-$X_5$(n,k)). In an embodiment, the audio processing device comprises a wind noise detector. In an embodiment, the audio processing device comprises a correlation detector and is configured to determine cross-correlation between two input signals selected among the five signals $X_1$(n,k)-$X_5$(n,k). In an embodiment, the audio processing device comprises an auto-correlation detector and is configured to determine auto-correlation of a signal selected among signals $X_1$(n,k)-$X_5$(n,k). In an embodiment, the activation or deactivation (or aggressiveness) of the current scheme for minimizing un-correlated signal components (e.g. wind noise) is dependent on a control signal from one or more of the detector(s).

The resulting enhanced signal Y assumed to be in a time-frequency representation) may be further processed in a subsequent signal processing unit (not shown here) before being operationally connected to synthesis filter bank S-FB to provide output signal OUT in the time domain. Output signal OF is operationally connected to output unit, OU, which may be embodied in various ways as e.g. indicated in connection with FIG. 10.

The algorithm of the present disclosure is configured to optimize the output signal by selecting, at a given point in time and at a given frequency (i.e. in a given TF-unit), the signal that has the lowest magnitude among the available input signals. In case that a user (or the device itself) in a given acoustic environment has selected a directional signal as the preferred signal to listen to, e.g. to minimize signals from behind the user, the present algorithm can improve the selected signal (e.g. including improving a user's perception of a speech signal) by choosing time-frequency units from an omni-directional signal input. This could e.g. be the case if a source of un-correlated noise (e.g. wind noise) is predominately arriving from a direction defined by the directional microphone characteristic (e.g. in front of the user).

FIGS. 6A and 6B show illustrative examples of time-frequency representations of first and second electric input signals and a resulting enhanced output signal according to an embodiment of the present disclosure. FIG. 6A shows exemplary magnitudes (Mag) of input signals $X_1$ (top table) and $X_2$ (middle table) to a noise minimization algorithm that for each time frequency unit (k,m) selects the one having the lowest magnitude (Mag) and includes that in the resulting enhanced signal Y(k,m) (bottom table). Each table shows values of magnitude (Mag) in arbitrary units of a complex signal in eight frequency bands ($k_1$-$k_8$) for twelve time frames ($m_1$-$m_{12}$). The upper table shows magnitude values of first input signal $X_1$ on a white background, whereas the middle table shows magnitude values of second input signal $X_2$ on a grey background. The lower table showing the magnitude values of the resulting enhanced signal Y (Mag(Y(k,m))=Min(Mag($X_1$(k,m)); Mag($X_2$(k,m)))) indicates by its background shading for each magnitude value its origin by having a white (origin $X_1$) or grey background (origin $X_2$), respectively.

In the scheme illustrated in FIGS. 6A and 6B, energy (magnitude) minimization of the resulting signal Y is achieved by minimizing the magnitude of each TF-unit. Alternatively, the minimization of the resulting signal Y may be performed for each time frame, so that the resulting signal Y(m) is determined from the inputs signals (here $X_1$, $X_2$) in such a way that the energy (proportional to the SUM($|X_i(k,m)|^2$) at a given time instant m is minimized. That would result in—at a given time instant m—selecting all time units (the whole time frame) from the input signal having the lowest total energy at that time instant. This would result in an assembly of time frames in the resulting signal Y(m) selected among the time frames of the available input signals (here $X_1$(m), $X_2$(m)).

FIG. 6B illustrates frequency spectra (magnitude, arbitrary units) of a specific time frame (here $m_1$) for the first $X_1$(k,$m_1$) (top graph) and second $X_2$(k,$m_1$) (middle graph) input signals and the resulting enhanced signal Y(k,$m_1$) (bottom graph). The graphs of FIG. 6B reflect the values of the magnitudes of the respective signals indicated in the first column (corresponding to time instant $m_1$) of the tables of FIG. 6A. It is thereby illustrated that the time frequency units (k,$m_1$) (k=1, 2, . . . , K=8) of the resulting signal Y comprises the minimum values of the magnitudes of the corresponding time frequency units (k,$m_1$) of the input signals $X_1$, $X_2$.

Figure 7A:
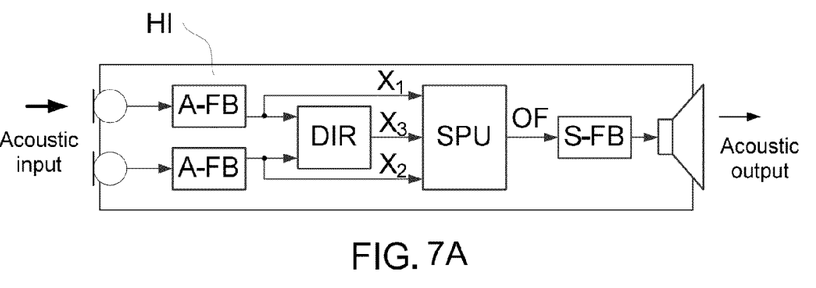
FIGS. 7A-7B show embodiments of a hearing instrument (FIG. 7A) and a headset (FIG. 7B), respectively, according to the present disclosure.
Figure 7B:
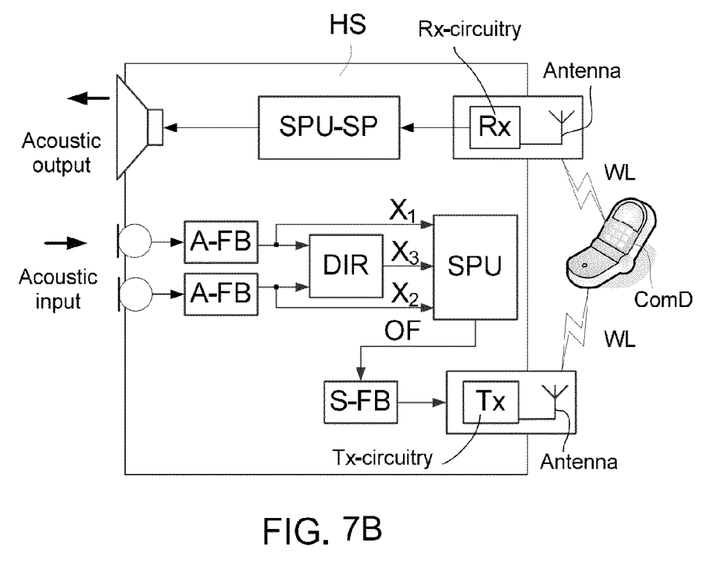

FIGS. 7A and 7B show embodiments of a hearing instrument (FIG. 7A) and a headset (FIG. 7B), respectively, according to the present disclosure.

FIG. 7A illustrates an audio processing device in the form of a listening device, e.g. a hearing instrument (HI). The embodiment of FIG. 7A is equivalent to the upper part of the embodiment of FIG. 5 comprising two microphones ($IU_1$, $IU_2$) and a directional unit DIR. The hearing instrument HI of FIG. 7A comprises a forward path from a pair of (omnidirectional) microphone units (for picking up each their version of an Acoustic input) via a directional unit (DIR) and a signal processing unit (SPU) to a speaker unit. The signal processing unit SPU includes the noise minimization algorithm according to the present disclosure, e.g. to minimize wind noise in a resulting enhanced signal of the forward path (as e.g. discussed in connection with FIGS. 4B and 4C). The signal processing unit SPU further includes other processing algorithms for enhancing an input audio signal before being presented to a user. The signal processing unit SPU e.g. comprises algorithms for adapting the Acoustic output to a user's hearing impairment, including applying a frequency (and input level) dependent gain.

FIG. 7B illustrates an audio processing device in the form of a listening device, e.g. a headset (HS) in wireless communication with a communication device (ComD). The headset (HS) comprises (substantially) independent microphone- and speaker-paths. The speaker path (upper part of FIG. 7B) comprises a wireless receiver (comprising Antenna and Rx-circuitry) for receiving an audio signal from a communication device (ComD), e.g. a cellular telephone, via a wireless link WL. The speaker path further comprises a signal processing unit (SPU-SP) for processing the audio signal extracted by the wireless receiver and a speaker for converting the processed audio signal to an output sound (Acoustic output) for being perceived by a user of the headset. The microphone path (lower part of FIG. 7B) is identical to the forward path of the hearing instrument of FIG. 7A, except that the output transducer of the headset (HS) is a wireless transmitter for establishing a wireless link to the communication device (ComD). The headset is thereby (using the speaker- and microphone-paths) configured to wirelessly establish a bi-directional audio link (WL) (e.g. a telephone conversation) to the communication device (ComD).

The invention is defined by the features of the independent claim(s). Preferred embodiments are defined in the dependent claims. Any reference numerals in the claims are intended to be non-limiting for their scope.

Some preferred embodiments have been shown in the foregoing, but it should be stressed that the invention is not limited to these, but may be embodied in other ways within the subject-matter defined in the following claims and equivalents thereof.

REFERENCES

EP1448016A1 (OTICON) Aug. 18, 2004
US20120253798A1 (BOSE CORP) Oct. 4, 2012
GB2453118A (MOTOROLA) Apr. 1, 2009
WO2008041730A1 (MATSUSHITA) Apr. 10, 2008
EP1339256A2 (PHONAK) Aug. 27, 2003
EP2463856A1 (OTICON) Jun. 13, 2012

The invention claimed is:

1. An audio processing device, comprising:
a multitude of electric input signals, each electric input signal being provided in a digitized form, and further in a time-frequency representation comprising a number of frequency bands k and a number of time instances m, a control unit receiving said digitized electric input signals and providing a resulting signal, wherein the control unit is configured to determine the resulting signal from said digitized electric input signals, or signals derived therefrom, according to a predefined scheme, wherein the predefined scheme comprises that the contents of a given time-frequency bin (k,m) of the resulting signal is determined from the content of the corresponding time-frequency bin (k,m) of the electric input signal, or a signal derived therefrom, comprising the least energy among said multitude of electric input signals.

2. An audio processing device according to claim 1 wherein one or more of said electric input signals $X_i(k,m)$ (i=1, 2, ..., N) represents a signal from an input transducer, such as a microphone or a wireless receiver.

3. An audio processing device according to claim 1 wherein one or more of said electric input signals $X_i(k,m)$ (i=1, 2, ..., N) represents an omni-directional signal or a directional signal.

4. An audio processing device according to claim 1 wherein an electric input signal $X_i$ is an output from a processing algorithm in the sense that the electric input signal $X_i$ is the resulting signal after having been subject to a processing algorithm.

5. An audio processing device according to claim 1 comprising at least three electric input signals, first and second electric input signals from two microphones and a third electric input signals from a directional algorithm providing a weighted combination of said first and second electric input signals.

6. An audio processing device according to claim 5 wherein the control unit is configured to optimize the directional signal by inserting signal components from the two microphones having lower energy than the corresponding signal components of the directional input signal.

7. An audio processing device according to claim 1 comprising a microphone system comprising at least two microphones for converting a sound field to respective time variant electric input signals and at least two time to time time-frequency conversion units, one for each microphone, to provide time-frequency representations of each electric input signal in a number of frequency bands k and a number of time instances m.

8. An audio processing device according to claim 1 comprising a normalization filter operationally connected to one of said at electrical input signals, the normalization filter being configured to have a transfer function $H_N(f)$, f being frequency, which makes the electric input signal in question comparable and interchangeable with other normalized electric input signals.

9. An audio processing device according to claim 1 wherein the control unit comprises a combination unit allowing a weight P to be applied to at least one of the electric input signals or to a signal derived therefrom.

10. An audio processing device according to claim 9 wherein the weight P is dependent on frequency.

11. An audio processing device according to claim 10 wherein the control unit is configured to provide that the relative size of weights $P_q(f)$ and $P_j(f)$ for input signal q and j, respectively, is influenced by the location of the input transducers that provide the electric input signals q and j, respectively, relative to sound sources of the current sound field.

12. An audio processing device according to claim 10 wherein a weighting factor $P_i(f)$ of an input signal is adaptively determined dependent on an output from an environment detector.

13. An audio processing device according to claim 12, wherein
the environment detector is a wind noise detector.

14. An audio processing device according to claim 1 comprising a wind noise detector for providing an estimate of the amount of wind noise or any other un-correlated noise present at a specific point in time.

15. An audio processing device according to claim 1, configured to provide that the phase of the resulting signal is determined by the origin of the signal at a particular time.

16. An audio processing device according to claim 1, configured to provide that the phase of the resulting signal is synthesized or smoothed to avoid large changes in phase from time instance to time instance and/or from frequency band to frequency band.

17. An audio processing device according to claim 1, further comprising:
an artifact detector providing an artifact measure indicative of presence of fluctuating gains, which may be a source of artifacts introduced by a processing algorithm,
wherein the control unit is configured to disregard a proposal of the predefined scheme, if the artifact measure indicates that the artifact produced by the predefined scheme is audible.

18. An audio processing device according to claim 17 comprising:
two microphone input signals and a directional input, wherein the control unit is configured to maintain the directional signal in cases where the artifacts created by the predefined scheme are audible.

19. An audio processing device according to claim 1 comprising an output transducer for converting an electric signal to a stimulus perceived by the user as an acoustic signal.

20. An audio processing device according to claim 1 comprising a hearing aid or a cell phone.

21. A method of operating an audio processing device, the method comprising:
providing a multitude of electric input signals, each being provided in a digitized form and further in a time-frequency representation comprising a number of frequency bands k and a number of time instances m;
providing a resulting signal based on said digitized electric input signals in a time-frequency representation; and
determining the resulting signal from said digitized electric input signals, or signals derived therefrom, according to a predefined scheme, wherein the predefined scheme comprises that the content of a given time-frequency bin (k,m) of the enhanced signal is determined from the content of the time-frequency bin (k,m) of the electric input signal comprising the least energy among said multitude of electric input signals.

* * * * *